(12) United States Patent
Bauer et al.

(10) Patent No.: US 9,853,129 B2
(45) Date of Patent: Dec. 26, 2017

(54) FORMING NON-LINE-OF-SIGHT SOURCE DRAIN EXTENSION IN AN NMOS FINFET USING N-DOPED SELECTIVE EPITAXIAL GROWTH

(71) Applicant: Applied Materials, Inc., Santa Clara, CA (US)

(72) Inventors: Matthias Bauer, Sunnyvale, CA (US); Hans-Joachim Ludwig Gossmann, Summit, NJ (US); Benjamin Colombeau, Salem, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/242,078

(22) Filed: Aug. 19, 2016

(65) Prior Publication Data

US 2017/0330960 A1 Nov. 16, 2017

Related U.S. Application Data

(60) Provisional application No. 62/335,045, filed on May 11, 2016.

(51) Int. Cl.
| | |
|---|---|
| *H01L 29/66* | (2006.01) |
| *H01L 29/78* | (2006.01) |
| *H01L 29/08* | (2006.01) |
| *H01L 21/02* | (2006.01) |
| *H01L 21/306* | (2006.01) |
| *H01L 29/06* | (2006.01) |
| *H01L 29/26* | (2006.01) |
| *H01L 29/167* | (2006.01) |

(Continued)

(52) U.S. Cl.
CPC .. *H01L 29/66795* (2013.01); *H01L 21/02439* (2013.01); *H01L 21/02576* (2013.01); *H01L 21/02645* (2013.01); *H01L 21/02658* (2013.01); *H01L 21/30604* (2013.01); *H01L 29/0673* (2013.01); *H01L 29/0847* (2013.01); *H01L 29/167* (2013.01); *H01L 29/26* (2013.01); *H01L 29/6656* (2013.01); *H01L 29/7851* (2013.01); *H01L 21/02447* (2013.01); *H01L 29/1608* (2013.01); *H01L 29/20* (2013.01); *H01L 29/66636* (2013.01)

(58) Field of Classification Search
CPC ......... H01L 21/02576; H01L 21/02645; H01L 21/02439
See application file for complete search history.

(56) References Cited

U.S. PATENT DOCUMENTS

| | | |
|---|---|---|
| 7,863,163 B2 | 1/2011 | Bauer |
| 9,190,515 B2 | 11/2015 | Bauer |
| 2005/0250298 A1 | 11/2005 | Bauer |

OTHER PUBLICATIONS

Ikuta et al. "Characteristics of in-situ phosphorus-doped silicon selective epitaxial growth at atmospheric pressure", Journal of Crystal Growth 310 (2008) 4507-4510.

(Continued)

*Primary Examiner* — Amar Movva
(74) *Attorney, Agent, or Firm* — Patterson + Sheridan LLP

(57) ABSTRACT

A finFET device includes an n-doped source and/or drain extension that is disposed between a gate spacer of the finFET and a bulk semiconductor portion of the semiconductor substrate on which the n-doped source or drain extension is disposed. The n-doped source or drain extension is formed by a selective epitaxial growth (SEG) process in a cavity formed proximate the gate spacer.

14 Claims, 14 Drawing Sheets

(51) Int. Cl.
*H01L 29/16* (2006.01)
*H01L 29/20* (2006.01)

(56) References Cited

OTHER PUBLICATIONS

Roger Loo et al. "Maximization of Active As Doping in (Selective) Epitaxial Si and SiGe Layers." Electrochemical Society Proceedings vol. 2004-07.

Y. Tateshita et al. "Gate Overlapped Raised Extension Structure (GORES) MOSFET by Using In-Situ Doped Selective Si Epitaxy", Extended Abstracts of the 2005 International Conference on Solid State Devices and Materials, Kobe 2005. pp. 904-905.

Y. Kikuchi et al. "A planar transistor for the 32-nm node and beyond with an ultra-shallow junction fabricated using in-situ doped selective Si epitaxy", 2006.

Y. Kikuchi et al. "A Promising Planar Transistor with in-situ Doped Selective Si Epitaxy Technology (GORES MOSFET) for 32nm node and beyond", 2006.

Shinichi Ike et al. "Influence of precursor gas on SiGe epitaxial material quality in terms of structural and electrical defects", Japanese Journal of Applied Physics 55, (2016). 6 pages.

Sathish Kumar Dhayalan et al. "On the manifestation of phosphorus-vacancy complexes in epitaxial Si:P films", Applied Physics Letters 105 (2016).

M. Bauer et al. "In-situ n-type doping during selective epitaxial growth of Si and Si:C alloys with high electrical active dopant levels".

Matthias Bauer et al. "Highly Tensile Strained Silicon-Carbon Alloys Epitaxially Grown into Recessed Source Drain Areas of NMOS Devices", Semiconductor Science and Technology. Dec. 2006.

P. Grudowski et al. "An Embedded Silicon-Carbon S/D Stressor CMOS Integration on SOI with Enhanced Carbon Incorporation by Laser Spike Annealing", 2007 IEEE International SOI Conference Proceedings.

M. Bauer, et al. "SiCP Selective Epitaxial Growth in Recessed Source/Drain Regions Yielding to Drive Current Enhancement in n-Channel MOSFET", 2008 ECS—The Electrochemical Society.

M. Bauer, "Si3H8 Based Epitaxy of Biaxially Stressed Silicon Films Doped with Carbon and Arsenic for Cmos Applications" Jan. 2005. Research Gate. Mater. Res. Soc. Symp. Proc. vol. 864 © 2005 Materials Research Society.

P.D. Agnello, et al. "Growth Rate Enhancement of Heavy n- and p-Type Doped Silicon Deposited by Atmospheric-Pressure Chemical Vapor Deposition at Low Temperatures", Soc. vol. 140, No. 9, Sep. 1993.

Tetsuya Ikuta et la. "Suppression of Surface Segregation and Heavy Arsenic Doping into Silicon During Selective Epitaxial Chemical Vapor Deposition Under Atmospheric Pressure", http://dx/doi.org/10.1063/1.2778539.2007.

Investigation of In-situ Boron-Doped Si Selective Epitaxial Growth by Comparison with Arsenic Doping. iopscience.iop.org. Nov. 2016. Japanese Journal of Applied Physics. vol. 47, No. 4, 2008, pp. 2452-2455.

Tetsuya Ikuta, "In situ arsenic-doped Si 1-y C y selective epitaxial growth under atmospheric pressure", http://aip.scitation.org/doi/10.1063/1.2838724.2008.

Tetsuya Ikuta, et al. "In-situ Doped Si Selective Epitaxial Growth for Raised Source/Drain Extension CMOSFET", Extended Abstracts of the 2007 International Conference on Solid State Devices and Materials, Tsukuba, 2007, pp. 368-369.

Tsutomu Imoto et al. "Novel Asymmetric Raised Source/Drain Extension MOSFET", SISPAD 2006.

"Novel Damascene Gate Metal-Oxide-Semiconductor Field-Effect Transistors Fabricated by In situ Arsenic- and Boron-Doped Epitaxy" , iopscience.iop.org. Nov. 2016.

Tetsuya Ikuta et al. "Atmospheric in situ Arsenic-Doped SiGe Selective Epitaxial Growth for Raised-Extension Ntype Metal-Oxide-Semiconductor Field-Effect Transistor". vol. 46, No. 4B, 2007, pp. 1916-1920.

FORMING NON-LINE-OF-SIGHT SOURCE DRAIN EXTENSION IN AN NMOS FINFET USING N-DOPED SELECTIVE EPITAXIAL GROWTH

CROSS-REFERENCE TO RELATED APPLICATIONS

This application claims benefit of U.S. provisional patent application Ser. No. 62/335,045, filed May 11, 2016, which is herein incorporated by reference.

BACKGROUND

Field

Embodiments of the present disclosure generally relate to the fabrication of integrated circuits and particularly to an apparatus and method for forming source drain extensions in an nMOS finFET using n-doped selective epitaxial growth (SEG).

Description of the Related Art

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

First, the formation of horizontal source/drain extensions becomes increasingly difficult for narrow and tall finFETs, since the fin-shaped channel region can be easily amorphized or otherwise damaged by conventional ion implantation techniques, such as beamline ion implant. Specifically, in some finFET architectures (e.g. horizontal Gate-All-Around, h-GAA), ion implantation can cause serious intermixing between the silicon channel and the adjacent silicon-germanium (SiGe) sacrificial layer. Such intermixing is highly undesirable, since the ability to selectively remove the sacrificial SiGe layer is then compromised. In addition, repair of such implant damage via thermal anneal increases the thermal budget of the finFET device.

Second, precise placement of a desired dopant in the horizontal source/drain extension region of a finFET is at best very difficult, since the source/drain extension in a finFET can be covered by other structures. For example, an (internal) sidewall spacer on the sacrificial SiGe superlattice (SL) layer typically covers the source/drain extension region at the time that doping is performed. Consequently, conventional line-of-sight ion implantation techniques cannot directly deposit dopants uniformly to the finFET source/drain extension region.

Third, in nMOS devices, strong diffusion of phosphorous from heavily doped SiP regions into the channel is a concern in smaller finFETs. Thus, while higher concentrations of phosphorous allows very low contact resistance and can beneficially reduce resistivity in the source and drain regions of a finFET, the risk of phosphorus diffusion from a source/drain extension is greatly increased, particularly for finFETs having smaller dimensions.

Accordingly, there is a need for techniques for precisely doping source/drain regions in finFET devices that are currently available or are under development. This and other needs are addressed in the present disclosure.

SUMMARY OF THE DISCLOSURE

Embodiments of the present disclosure relate to a semiconductor device that includes a cavity filled with an n-doped semiconductor material, where the filled cavity is disposed between an existing structure of the semiconductor device and a bulk semiconductor portion of the semiconductor substrate on which the n-doped silicon-containing material is formed. In one or more embodiments, the semiconductor device comprises a finFET device. In such embodiments, the n-doped silicon-containing material forms an n-doped source or drain extension disposed between a gate spacer of the finFET and a bulk semiconductor portion of the semiconductor substrate on which the n-doped source or drain extension is disposed.

Embodiments of the disclosure provide a method of forming a semiconductor device on a semiconductor substrate. The method comprises performing an anisotropic etch process on a semiconductor material to expose a surface in the semiconductor material, wherein the exposed surface is disposed between an existing structure of the semiconductor device and a bulk semiconductor portion of the semiconductor substrate on which the semiconductor material is formed, performing an isotropic etch process on the exposed sidewall to form a cavity in the semiconductor material that is disposed between the existing structure and the bulk semiconductor portion of the semiconductor substrate, and forming a layer of deposited material via a (SEG) process on a surface of the cavity, wherein the deposited material includes silicon and an n-type dopant.

Embodiments of the disclosure may further provide a finFET device that comprises a bulk semiconductor region that is formed from a semiconductor substrate, a semiconductor fin, and a gate electrode structure. The semiconductor fin is disposed on the bulk semiconductor region and includes an n-doped source region, an n-doped drain region, a channel region connecting the n-doped source region and the n-doped drain region, and at least one epitaxially grown n-doped source-drain extension region. The gate electrode structure is formed on a portion of the semiconductor fin and includes a gate electrode layer. A first gate spacer is formed on a first sidewall of the gate electrode layer, and a second gate spacer formed on a second sidewall of the gate electrode layer, wherein at least one n-doped source-drain extension region is disposed between the bulk semiconductor region and one of the first gate spacer or the second gate spacer.

Embodiments of the disclosure may further provide a nanowire/nanosheet structure that comprises a bulk semiconductor region formed from a semiconductor substrate, a silicon (Si) layer that is formed on the semiconductor substrate and includes an epitaxially grown arsenic-(As) doped portion, and a silicon-germanium (Si—Ge) layer that is disposed on the silicon layer and includes a spacer structure in contact with the epitaxially grown arsenic-doped portion, wherein the epitaxially grown arsenic-doped portion is disposed between the spacer structure and the bulk semiconductor region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

DETAILED DESCRIPTION

Embodiments of the present disclosure relate to a semiconductor device, and a method of forming the same, that includes an n-doped semiconductor material that is formed within a region that is disposed between an existing structure of the semiconductor device and a bulk semiconductor portion of the semiconductor substrate. In one or more embodiments, the semiconductor device comprises a finFET device. In such embodiments, the n-doped silicon-containing material forms an n-doped source or drain extension disposed between a gate spacer of the finFET and a bulk semiconductor portion of the semiconductor substrate on which the n-doped source or drain extension is disposed.

Figure 1:
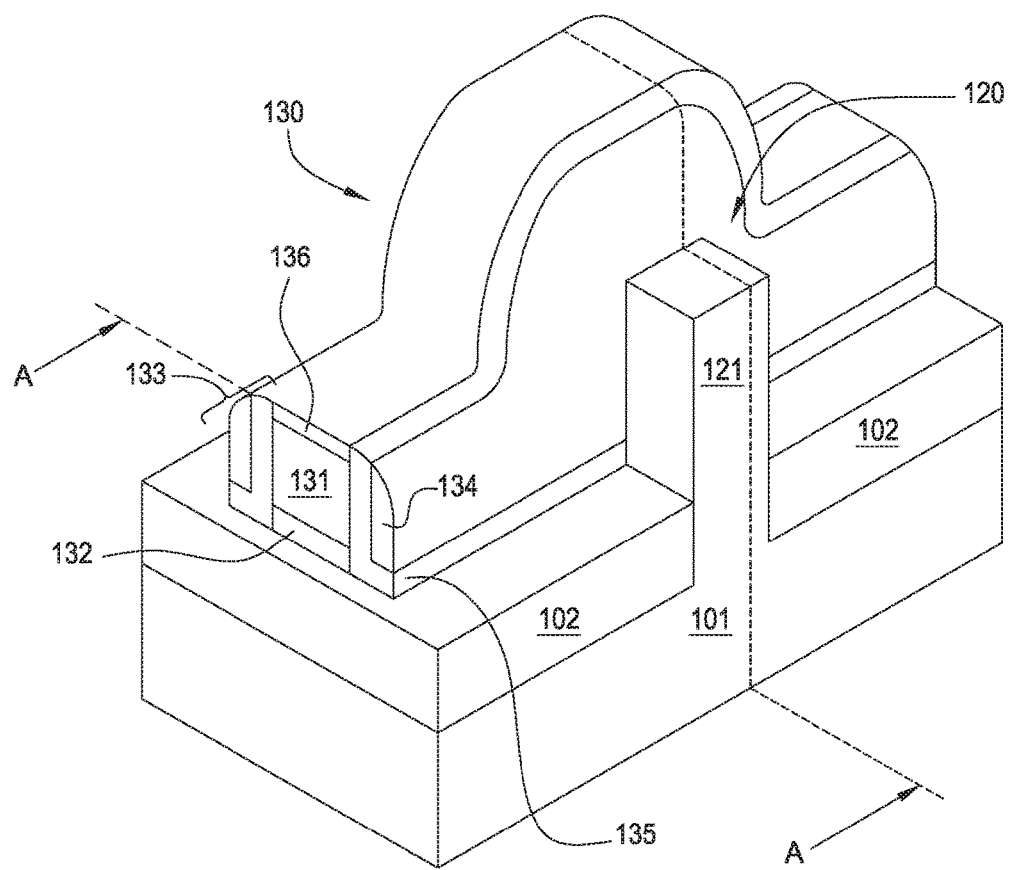
FIG. 1 is a perspective view of a fin-field-effect transistor (finFET), according to an embodiment of the disclosure.

FIG. 1 is a perspective view of a fin-field-effect transistor (finFET) 100, according to an embodiment of the disclosure. FinFET 100 includes a semiconductor substrate 101, insulation regions 102 formed on a surface of semiconductor substrate 101, a fin structure 120 formed on the surface of semiconductor substrate 101, and a gate electrode structure 130 formed on insulation regions 102 and on fin structure 120. A top portion of fin structure 120 is exposed and electrically coupled to the source contact (not shown) of finFET 100, another top portion of fin structure 120 is exposed and electrically coupled to the drain contact (not shown) of finFET 100, and a center portion of semiconductor fin 121 includes the channel region of finFET 100. Gate electrode structure 130 serves as the gate of finFET 100.

Semiconductor substrate 101 may be a bulk silicon (Si) substrate, a bulk germanium (Ge) substrate, a bulk silicon-germanium (SiGe) substrate, or the like. Insulation regions 102, alternatively referred to as shallow trench isolation (STI), may include one or more dielectric materials, such as silicon dioxide ($SiO_2$), silicon nitride ($Si_3N_4$), or multiple layers thereof. Insulation regions 102 may be formed by high-density plasma (HDP), flowable chemical vapor deposition (FCVD), or the like.

Fin structure 120 includes a semiconductor fin 121 and fin spacers (not shown for clarity) that are formed on sidewalls of semiconductor fin 121. Semiconductor fin 121 may be formed from semiconductor substrate 101 or from a different semiconductor material that is deposited on semiconductor substrate 101. In the latter case, the different semiconductor material may include silicon-germanium, a III-V compound semiconductor material, or the like.

Gate electrode structure 130 includes a gate electrode layer 131, a gate dielectric layer 132, gate spacers 133, and a mask layer 136. In some embodiments, gate electrode layer 131 includes a polysilicon layer or a metal layer that is capped with a polysilicon layer. In other embodiments, gate electrode layer 131 includes a material selected from metal nitrides (such as titanium nitride (TiN), tantalum nitride (TaN) and molybdenum nitride (MoNx)), metal carbides (such as tantalum carbide (TaC) and hafnium carbide (HfC)), metal-nitride-carbides (such as TaCN), metal oxides (such as molybdenum oxide (MoOx)), metal oxynitrides (such as molybdenum oxynitride (MoOxNy)), metal silicides (such as nickel silicide), and combinations thereof. Gate electrode layer 131 can also be a metal layer capped with a polysilicon layer.

Gate dielectric layer 132 may include silicon oxide ($SiO_x$), which may be formed by a thermal oxidation of semiconductor fin 121. In other embodiments, gate dielectric layer 132 is formed by a deposition process. Suitable materials for forming gate dielectric layer 132 include silicon oxide, silicon nitrides, oxynitrides, metal oxides such as $HfO_2$, $HfZrO_x$, $HfSiO_x$, $HfTiO_x$, $HfAlO_x$, and combinations and multi-layers thereof. Gate spacers 133 are formed on sidewalls of gate electrode layer 131, and each may include a nitride portion 134 and/or an oxide portion 135 as shown. In some embodiments, mask layer 136 may be formed on gate electrode layer 131 as shown, and may include silicon nitride.

Figure 2:
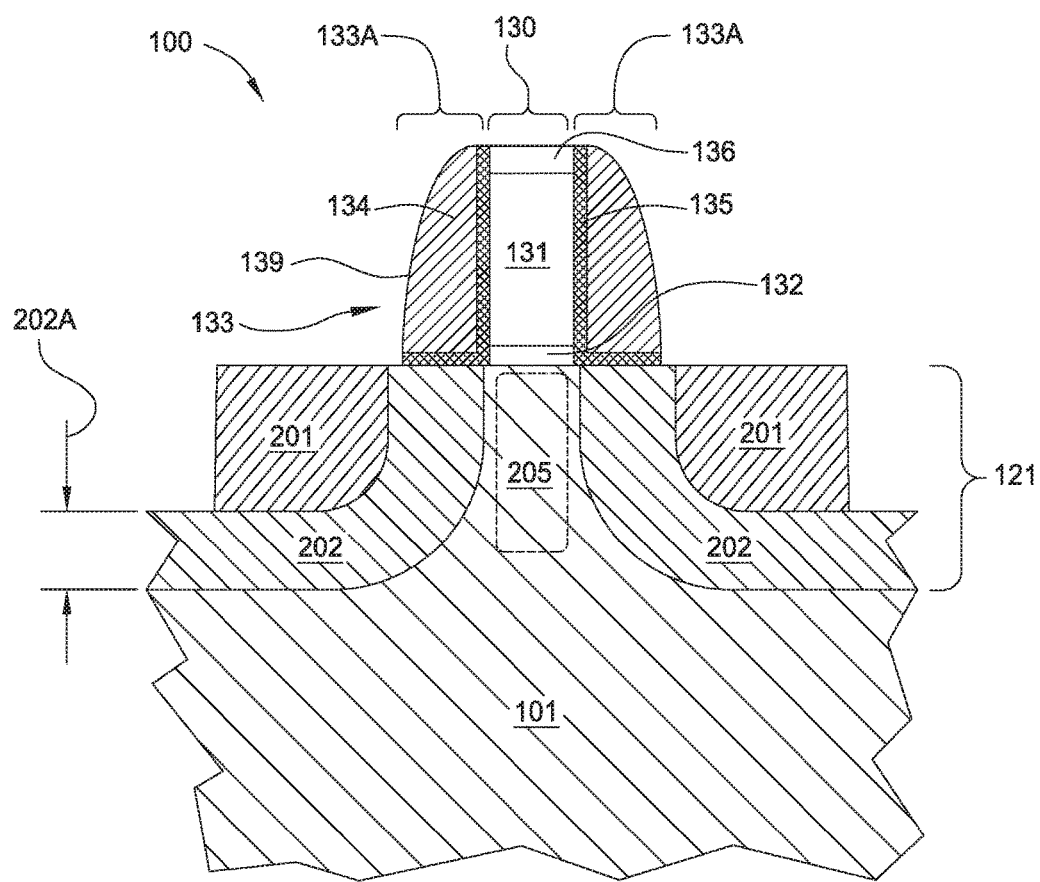
FIG. 2 is a cross-sectional view of the finFET of FIG. 1, according to an embodiment of the disclosure.

FIG. 2 is a cross-sectional view of finFET 100, according to an embodiment of the disclosure. The cross-sectional view illustrated in FIG. 2 is taken at section A-A in FIG. 1. As shown, finFET 100 includes fin 121 with heavily n-doped regions 201, n-doped extension regions 202, and a channel region 205.

Heavily n-doped regions 201 form the source and drain regions of finFET 100, and include relatively high concentrations of n-dopants, such as phosphorus (P). For example, in some embodiments, a concentration of n-dopants in heavily n-doped regions 201 may be as high as $5 \times 10^{21}$ atoms/cm$^3$. Heavily n-doped regions 201 may be produced by any suitable doping technique. Because heavily n-doped regions 201 are generally not covered by an intervening structure of finFET 100 at the time of doping, a line-of-sight doping technique, such as beamline ion implantation, may be employed. Alternatively, a conformal doping technique, such as plasma doping (PLAD), may be employed to form heavily n-doped regions 201, since a significant portion of each heavily n-doped region 201 is generally exposed at the time of doping.

N-doped extension regions 202 form the source and drain extensions of finFET 100, and include one or more n-dopants. According to embodiments of the disclosure, n-doped extension regions 202 include one or more n-dopants that act as a diffusion barrier for the n-dopants located in heavily n-doped regions 201. Thus, because n-doped extension regions 202 are disposed between channel region 205 and heavily n-doped regions 201, n-dopants located in heavily n-doped regions 201, such as phosphorus, cannot diffuse into channel region 205. With the small geometries associated with modern finFET devices, a width 133A of gate spacers 133, which is also approximately the distance between heavily n-doped regions 201, can be just a few nanometers. Therefore, such n-dopant diffusion can be a serious challenge in nMOS devices, such as finFET 100.

In some embodiments, the n-dopants located in heavily n-doped regions 201 may include phosphorus. In such embodiments, the n-dopants included in n-doped extension regions 202 may include arsenic (As), which can act as a significant diffusion barrier to phosphorus diffusion or simply as a spatial (geometrical) offset. Alternatively or additionally, in such embodiments, the n-dopants included in n-doped extension regions 202 may include antimony (Sb), which may also act as a partial barrier to phosphorus diffusion.

In some embodiments, n-doped extension regions 202 are formed with a thickness 202A that is less than width 133A of gate spacers 133. For example, in such embodiments, thickness 202A of n-doped extension regions 202 may be approximately 1 nanometer less that width 133A. Consequently, in such embodiments, n-doped extension regions 202 do not extend into channel region 205.

Furthermore, according to embodiments of the disclosure, n-doped extension regions 202 are formed via a (SEG) process. Specifically, a cavity is formed in a portion of semiconductor fin 121 that is disposed between gate spacers 133 and a bulk semiconductor portion of semiconductor substrate 101. The cavity is then filled with n-doped semiconductor material, such as a silicon material that is doped with arsenic (As) (e.g., also referred to herein as Si:As). Thus, source-drain extensions for finFET 100 are formed in a region of semiconductor fin 121 that is between an existing structure of finFET 121 and a bulk semiconductor portion of semiconductor substrate 101. Furthermore, the n-dopants included in n-doped extension regions 202 can be selected to act as a diffusion barrier for the n-dopants located in heavily n-doped regions 201. It is noted that, due to the presence of gate spacers 133, n-doped extension regions 202 cannot be formed by either beamline ion implantation or PLAD. Various embodiments by which n-doped extension regions 202 may be formed in finFET 100 are described below in conjunction with FIGS. 3 and 4A-4E.

Figure 3:
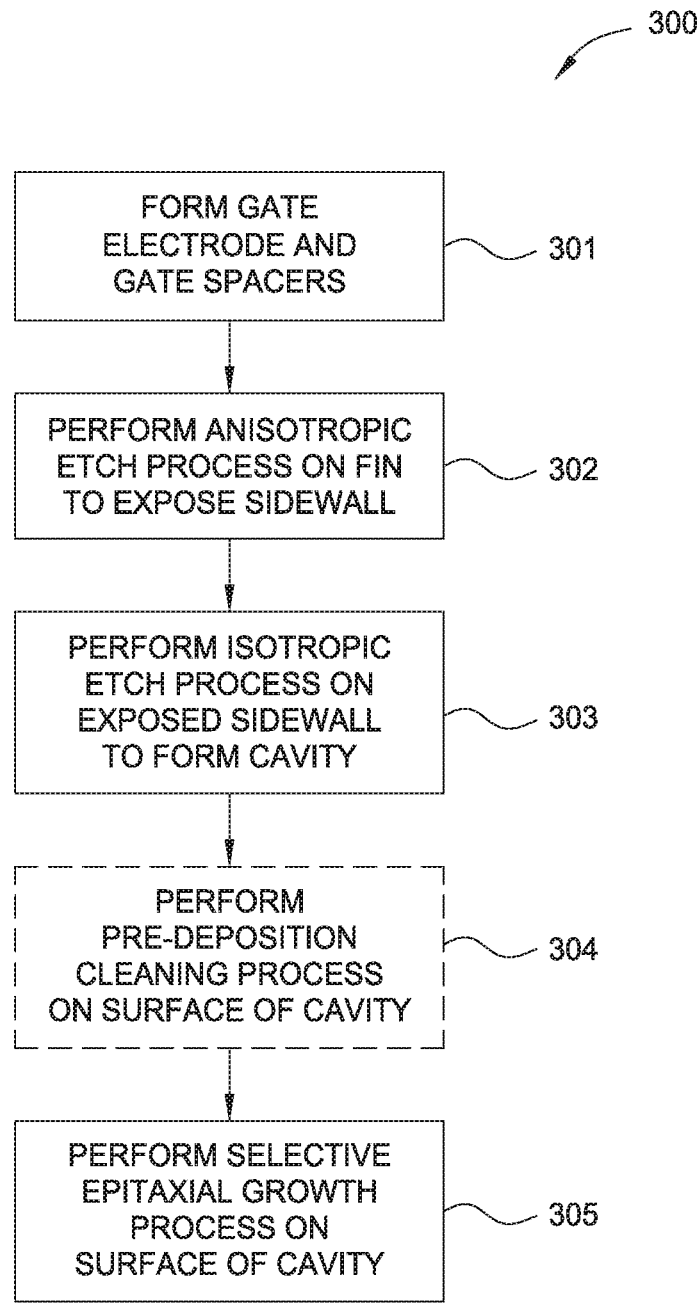
FIG. 3 is a flowchart of a manufacturing process for forming an nMOS finFET, according to various embodiments of the disclosure.

FIG. 3 is a flowchart of a manufacturing process 300 for forming an nMOS finFET, according to various embodiments of the disclosure. FIGS. 4A-4E are schematic cross-sectional views of a semiconductor device corresponding to various stages of process 300, such as finFET 100 in FIG. 1, according to various embodiments of the disclosure. Although process 300 is illustrated for forming an n-doped extension region, process 300 may be employed to form other structures on a substrate as well.

Figure 4A:
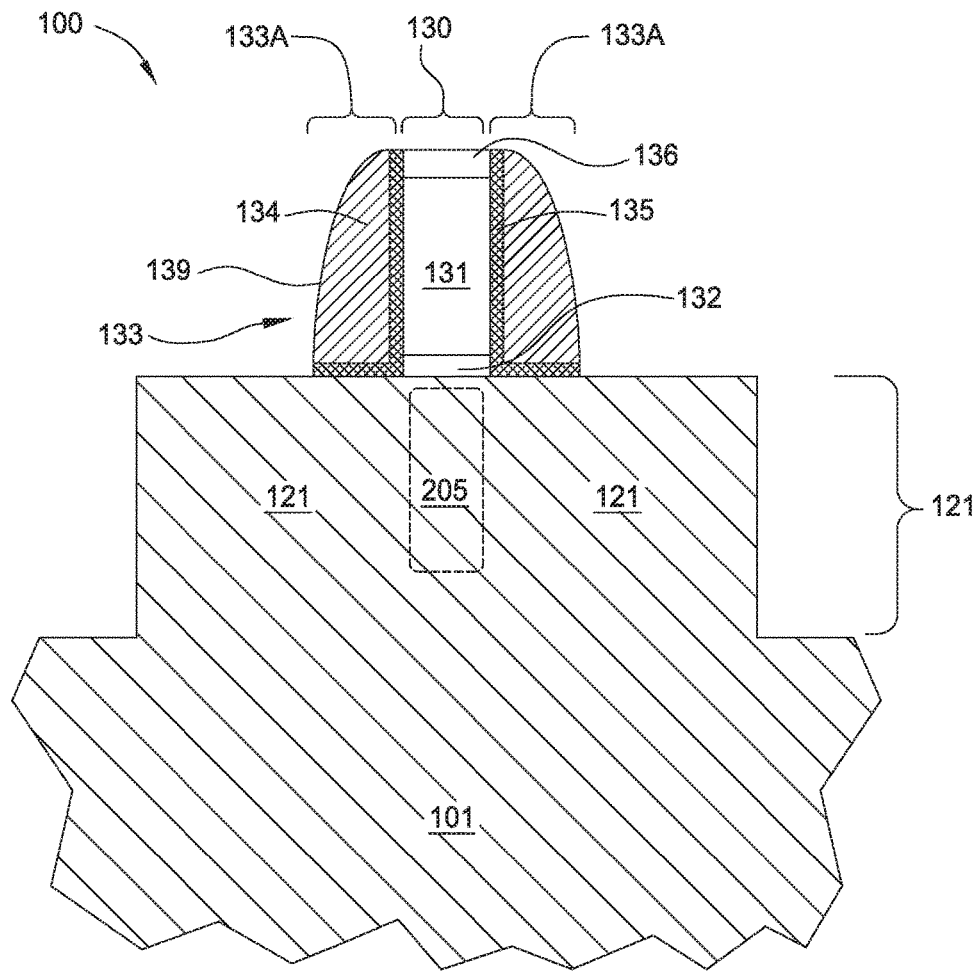
FIGS. 4A-4E are schematic cross-sectional views of a semiconductor device corresponding to various stages of the process of FIG. 3, according to various embodiments of the disclosure.

Process 300 begins at step 301, in which a gate electrode 130 and gate spacers 133 are formed on semiconductor fin 121, as shown in FIG. 4A. In the embodiment illustrated in FIG. 4A, semiconductor fin 121 is formed from a portion of semiconductor substrate 101.

Figure 4B:
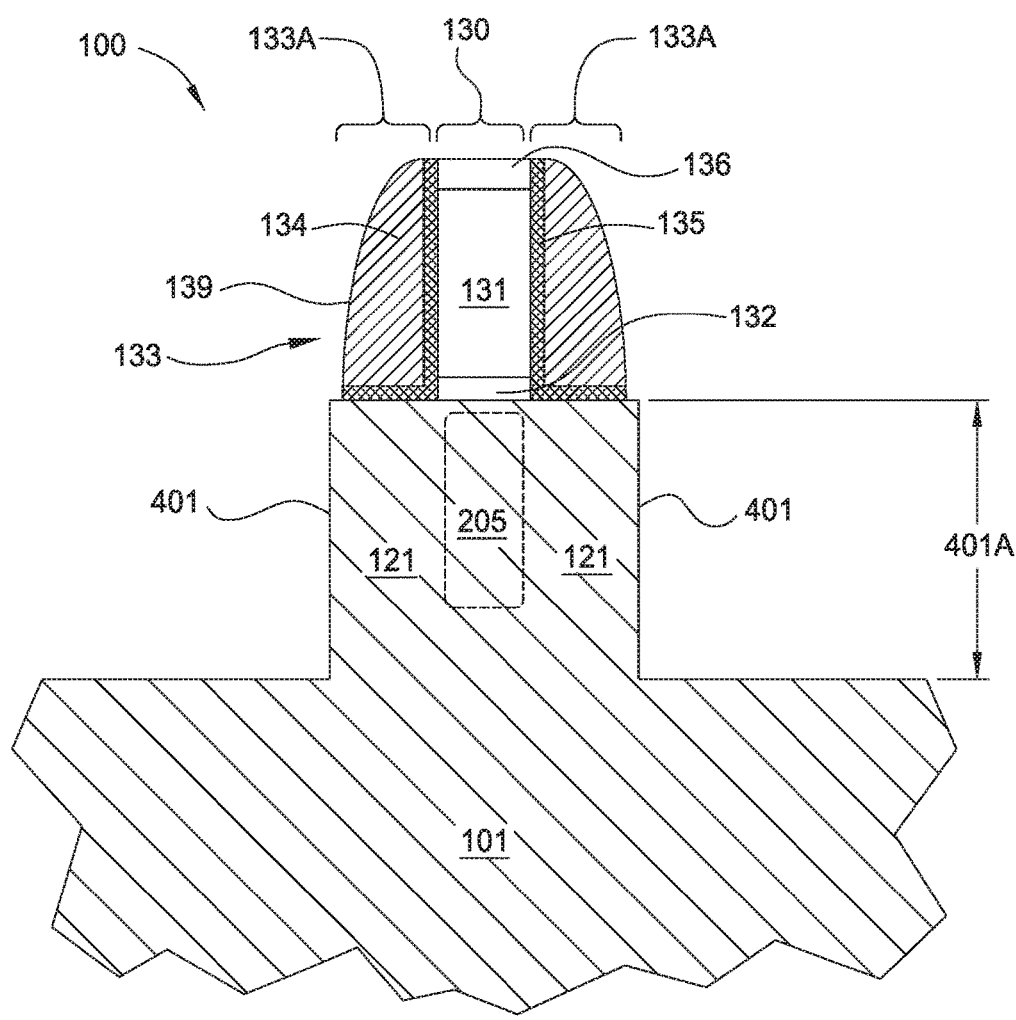

In step 302, an anisotropic etch process is performed on the portion of semiconductor fin 121 that is disposed between gate spacers 133 and a bulk semiconductor portion of semiconductor substrate 101. As a result, one or more sidewall surfaces 401 in the semiconductor material of semiconductor fin 121 are exposed, as illustrated in FIG. 4B. As shown, sidewall surface 401 is disposed between an existing structure of finFET 100 and a bulk semiconductor portion of semiconductor substrate 101. That is, sidewall surface 401 is disposed between gate spacers 133 and semiconductor substrate 101. Consequently, sidewall surface 401 is in a region of semiconductor fin 121 that is inaccessible to a conventional, surface-normal line-of-sight ion implantation technique.

The anisotropic etch process of step 302 may be selected to remove sufficient material from semiconductor fin 121 so that sidewall surface 401 has any suitable target length 401A. For example, in some embodiments, the anisotropic etch process of step 302 is performed so that sidewall surface 401 has a target length 401A of about 5 nm to about 10 nm. In other embodiments, sidewall surface 401 may have a target length 401A of more than 10 nm or less than 5 nm, depending on the geometry of gate spacers 133, the concentration of n-dopants in heavily n-doped regions 201, the dimensions of channel region 205, and other factors. The anisotropic etch process of step 302 may be, for example, a deep reactive-ion etch (DRIE) process during which gate spacers 133 and other portions of finFET 100 are masked.

Figure 4C:
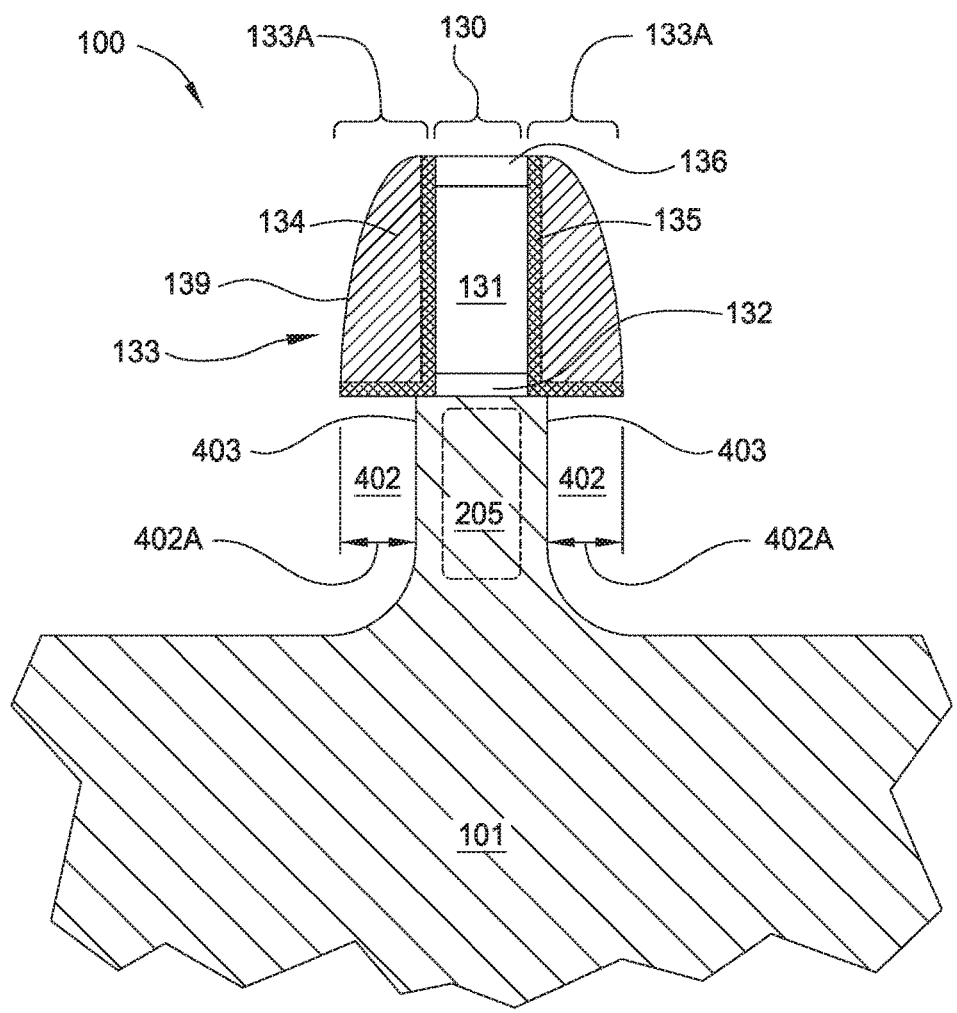

In step 303, an isotropic etch process is performed on sidewall surface 401 to form one or more cavities 402 in the material of semiconductor fin 121, as illustrated in FIG. 4C. As shown, each cavity 402 has a surface 403. Furthermore, each cavity 402 is disposed between an existing structure of finFET 100 (i.e., one of gate spacers 133) and the bulk semiconductor portion of semiconductor substrate 101. Consequently, portions of cavities 402 are each in a region of semiconductor fin 121 that is inaccessible to a line-of-sight ion implantation technique.

The isotropic etch process of step 303 may be selected to remove sufficient material from semiconductor fin 121 so that cavity 402 has any suitable target width 402A. For example, in some embodiments, the isotropic etch process of step 303 is performed so that cavity 402 has a target width 402A of about 2 nm to about 10 nm. In other embodiments, sidewall surface 401 may have a target width 402A of more than 10 nm or less than 2 nm, depending on the geometry of gate spacers 133, the concentration of n-dopants in heavily n-doped regions 201, and other factors. For example, in some embodiments, target width 402A may be selected so that cavities 402 have a target width 402A of no more than about 1 nm less than thickness 133A of gate spacers 133.

The isotropic etch process of step 303 may include any suitable etch process that is selective to the semiconductor material of semiconductor fin 121. For example, when semiconductor fin 121 includes silicon (Si), the isotropic etch process of step 303 may include one or more of an HCl-based chemical vapor etch (CVE) process, an HCl- and GeH$_4$-based CVE process, and/or a Cl$_2$-based CVE process.

In some embodiments, an optional step 304 is performed, in which a pre-deposition cleaning process or other surface preparation process is performed on surfaces 403 of cavities 402. The surface preparation process may be performed to remove native oxide on surface 403 and to otherwise prepare surface 403 prior to a (SEG) process performed in step 305. The surface preparation process may include a dry etch process, a wet etch process, or a combination of both.

In such embodiments, the dry etch process may include a conventional plasma etch, or a remote plasma-assisted dry etch process, such as a SiCoNi™ etch process, available from Applied Materials, Inc., located in Santa Clara, Calif. In a SiCoNi™ etch process, surfaces 403 are exposed to H$_2$, NF$_3$, and/or NH$_3$ plasma species, e.g., plasma-excited hydrogen and fluorine species. For example, in some embodiments, surfaces 403 may undergo simultaneous exposure to H$_2$, NF$_3$, and NH$_3$ plasma. The SiCoNi™ etch process of step 304 may be performed in a SiCoNi Preclean chamber, which may be integrated into one of a variety of multi-processing platforms, including the Centura™, Dual ACP, Producer™ GT, and Endura platform, available from Applied Materials. The wet etch process may include a hydrofluoric (HF) acid last process, i.e., the so-called "HF last" process, in which HF etching of surface 403 is performed that leaves surfaces 403 hydrogen-terminated. Alternatively, any other liquid-based pre-epitaxial pre-clean process may be employed in step 304.

Figure 4D:
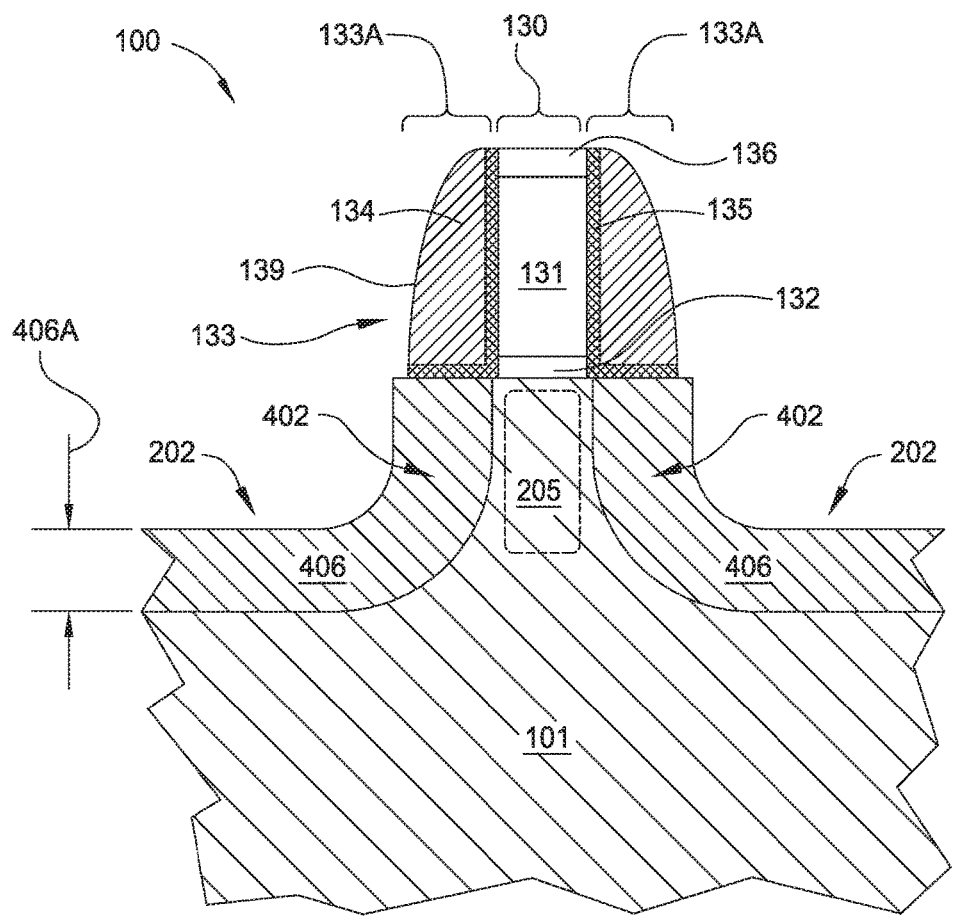

In step 305, a (SEG) process is performed on surfaces 403 to grow a layer of deposited material 406, thereby forming n-doped extension regions 202, as illustrated in FIG. 4D. Specifically, the deposited material includes a semiconductor material, such as silicon, and an n-type dopant. For example, in some embodiments, deposited material 406 includes Si:As, where the concentration of arsenic in deposited material 406 is selected based on the electrical requirements of finFET 100. It is noted that Si:As may be deposited via (SEG) with an electrically active dopant concentration of arsenic as high as about $5 \times 10^{21}$ atoms/cm$^3$. However, such high arsenic concentrations present in n-doped extension regions 202 can result in increases in resistivity due to the unwanted formation of AsV (arsenic-vacancy) complexes, and arsenic diffusion into channel region 205. Furthermore, AsPV (arsenic-phosphorous-vacancy) complexes may be formed in n-doped extension regions 202, causing increased diffusion of phosphorus into channel region 205. Consequently, in some embodiments, deposited material 406 includes an electrically active dopant concentration of arsenic no greater than about $5 \times 10^{20}$ atoms/cm$^3$.

In some embodiments, deposited material 406 may have a deposition thickness 406A of about 2 nm to about 10 nm. In other embodiments, deposited material 406 may have a deposition thickness 406A that is thicker than 10 nm for certain configurations of finFET 100. In some embodiments, deposition thickness 406A is selected so that deposition material 406 completely fills cavity 402, as shown in FIG. 4D. In other embodiments, deposition thickness 406A is selected so that deposition material 406 partially fills cavity 402, and covers the exposed surface of the semiconductor fin 121 that forms the cavity 402.

A suitable SEG process in step 305 may include specific process temperatures and pressures, process gases, and gas flows that are selected to facilitate selective growth of a particular n-doped semiconductor material. In embodiments in which the particular n-doped semiconductor material includes Si:As, a doping gas used in the SEG process of step 305 may include AsH$_3$, As(SiH$_3$)$_3$, AsCl$_3$, or TBA. Other gases employed in the SEG process may include dichlorosilane (DCS), HCl, SiH$_4$, Si$_2$H$_6$, and/or Si$_4$H$_{10}$. In such embodiments, the SEG process of step 305 may be performed in an atmospheric pressure or high sub-atmospheric pressure chamber with low H$_2$ carrier gas flow. For example, in such embodiments the process pressure in the processing chamber performing the SEG process may be on the order of about 20-700 T. In such embodiments, the high reactor pressure and low dilution (due to low carrier gas flow) can yield high arsenic and high dichlorosilane (H$_2$SiCl$_2$ or DCS) partial pressures, thereby favoring removal of chlorine (Cl) and excess arsenic from surface 403 during the SEG process. Consequently, high film growth rate and associated high arsenic incorporation rates are realized, and good crystal quality can be achieved.

The SEG process of step 305 may be performed in any suitable processing chamber, such as a processing chamber that is integrated into one of a variety of multi-processing platforms, including the Producer™ GT, Centura™ AP and Endura platform, available from Applied Materials. In such embodiments, the SiCoNi™ etch process of step 304 may be performed in another chamber of the same multi-processing platform.

Figure 4E:
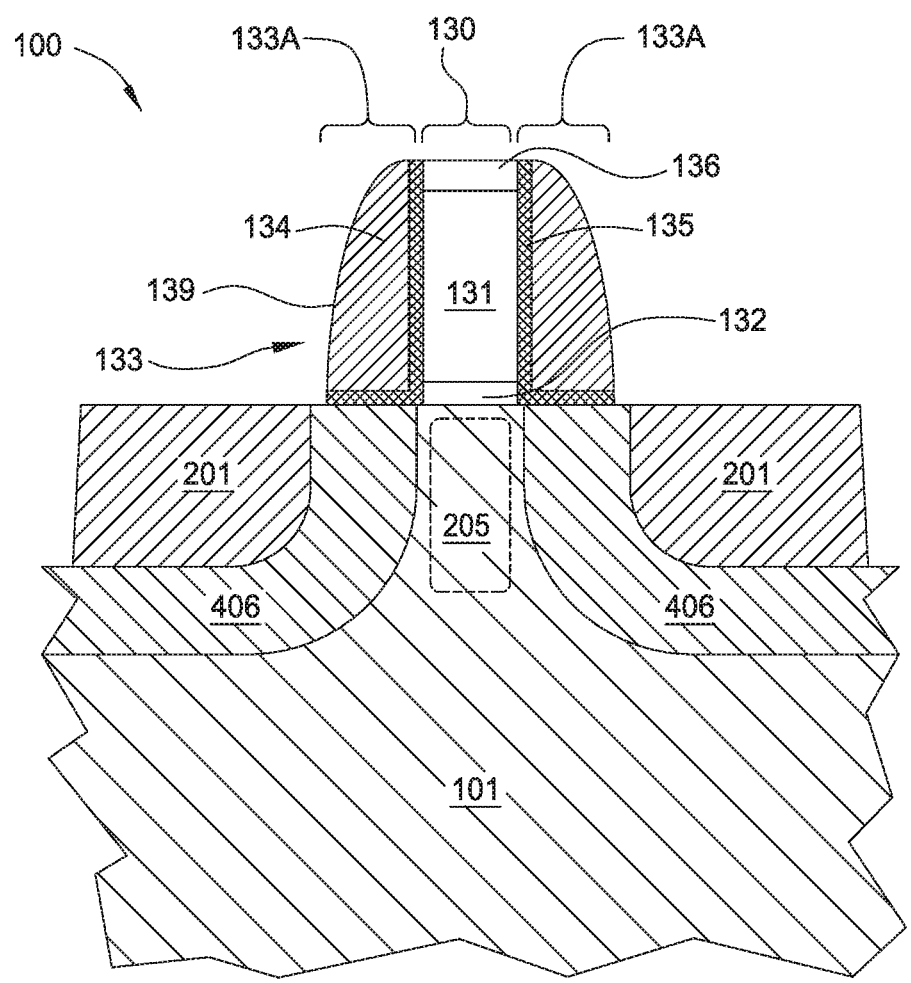

In step 306, a second SEG process is performed, in which heavily n-doped regions 201 are formed, as illustrated in FIG. 4E. Heavily n-doped regions 201 are formed on n-doped extension regions 202. Heavily n-doped regions 201 may be formed of any suitable semiconductor material, include doped silicon, doped silicon germanium, doped silicon carbon, or the like. The dopant or dopants may include any suitable n-dopant, such as phosphorus. For example, in some embodiments heavily n-doped regions 201 may include phosphorus-doped silicon (Si:P). Any suitable SEG process may be employed to form heavily n-doped regions 201. The thickness and other film characteristics of heavily n-doped regions 201 may be selected based on the electrical requirements of finFET 100, the size of finFET 100, and other factors.

In some embodiments, the second SEG process is performed in the same process chamber as the SEG process of step 305. Thus, n-doped extension regions 202 may be formed in what is effectively a preliminary deposition step during the formation of heavily n-doped regions 201. Consequently, in such embodiments, no dedicated process chamber is needed to form n-doped extension regions 202, and additional time for transferring a substrate from a first process chamber (for performing SEG of n-doped extension regions 202) to a second process chamber (for performing SEG of heavily n-doped regions 201) is avoided. In addition, deposition material 406 is not exposed to air in such embodiments. Alternatively, in some embodiments, the second SEG process is performed in a different process chamber than the SEG process of step 305, thereby reducing the number of process chambers that are exposed to hazardous dopants such as arsenic. In such embodiments, both chambers may be integrated into the same multi-processing platform, thereby avoiding a vacuum break and exposure of deposition material 406 to air.

After step 306, remaining components of finFET 100 may be completed using conventional fabrication techniques.

Implementation of process 300 enables the formation of n-doped extension regions 202 in a precisely defined location, i.e., in a region of semiconductor fin 121 that is difficult to access with conventional ion implantation techniques. In addition, the process by which n-doped extension region 202 are formed can be incorporated into an existing selective epitaxial growth step already employed in the fabrication of a finFET, thereby minimizing or eliminating disruptions to the process flow for forming a finFET. Furthermore, implant damage, i.e., defects from heavy mass ion implantation such as silicon interstitials or even silicon amorphization, is avoided, as well as any deleterious interactions between such crystal defects and high concentrations of arsenic and/or phosphorus. Therefore, no post implant anneal or associated additional thermal budget affecting processes are needed. Also, when the SEG process of step 305 is performed in the same process chamber as the SEG process of step 306, or in different process chambers on the same multi-processing platform, additional pre-clean related material loss is also avoided, since no vacuum break occurs between deposition of n-doped extension regions 202 and heavily n-doped regions 201.

As is well-known in the art, the introduction of tensile strain into the channel region of an nMOS finFET can increase charge mobility in the nMOS finFET. Furthermore, formation of an epitaxially grown Si:As material adjacent to channel region 205 of semiconductor fin 121, as described herein, can introduce significant tensile strain in channel region 205. For example, according to some embodiments of the disclosure, n-doped extension regions 202 can be deposited with an arsenic concentration sufficient to produce a targeted tensile strain within n-doped extension regions 202. Thus, in embodiments in which deposited material 406 includes epitaxially grown Si:As, an additional benefit of the formation of n-doped extension regions 202 in finFET 100 is that channel region 205 can have improved charge mobility as a result of tensile strain introduced therein by the formation of the n-doped extension regions 202.

In some embodiments, an optional carbon-containing layer is formed in cavities 402. In such embodiments, the carbon-containing layer may be a liner between n-doped extension region 202 and heavily n-doped region 201. One such embodiment is illustrated in FIG. 5.

Figure 5:
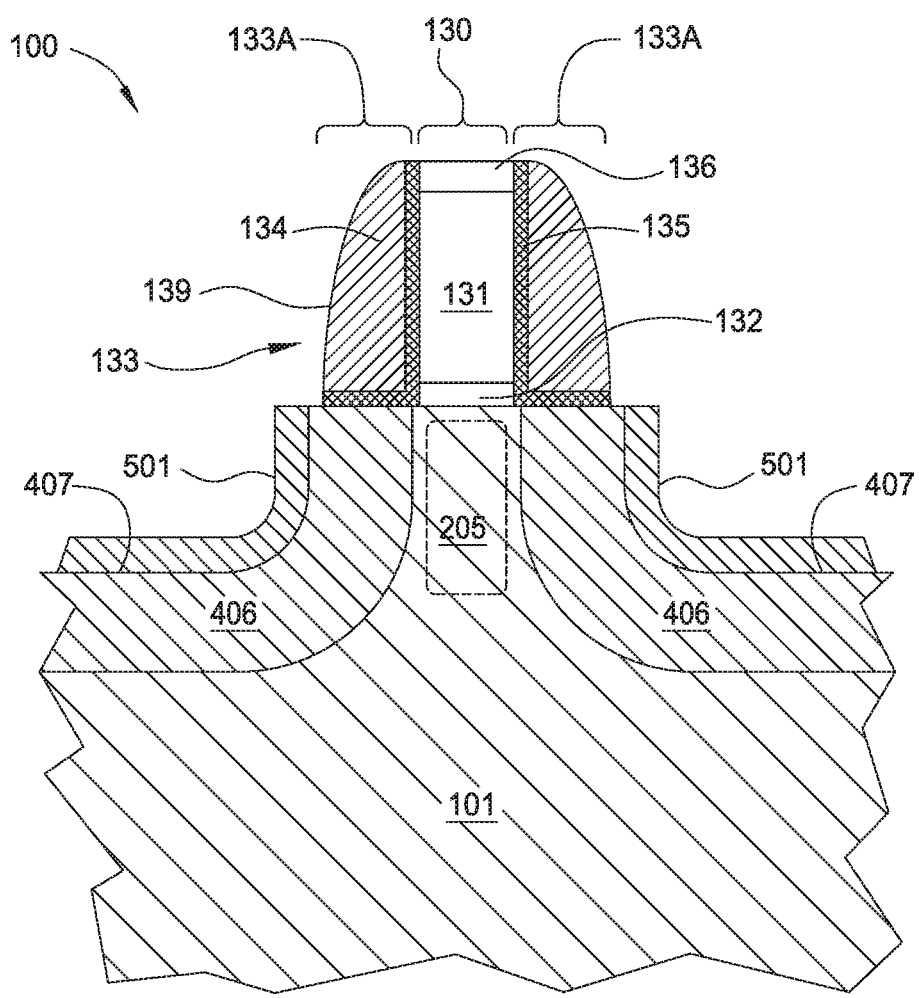
FIG. 5 is a schematic cross-sectional view of the finFET of FIG. 1 after formation of cavities, according to various embodiments of the disclosure.

FIG. 5 is a schematic cross-sectional view of finFET 100 after formation of cavities 402, according to various embodiments of the disclosure. As shown, a carbon-containing layer 501 is deposited on a surface 407 of deposited material 406. The presence of carbon (C) may enhance diffusion of arsenic while reducing the diffusion of phosphorus. Thus, in some embodiments, carbon-containing layer 501 includes between about 0.5% to about 1.0% carbon. In such embodiments, carbon-containing layer 501 may further include phosphorus, for example between about $1 \times 10^{20}$ atoms/cm$^3$ and about $5 \times 10^{20}$ atoms/cm$^3$. Such a carbon-containing layer may be grown in an atmospheric or near-atmospheric SEG chamber at a process temperature of about 650° C.+/−50° C. Thus, in embodiments in which carbon-containing layer 501 includes Si:C:P, a tri-layer structure is formed that includes Si:P (heavily n-doped region 201), Si:C:P (carbon-containing layer 501), and Si:As (n-doped extension regions 202). Such a tri-layer structure may cause diffusion of arsenic away from channel region 205, and towards heavily n-doped region 201

In some embodiments, an n-doped semiconductor material may be formed as part of a nanowire structure in regions of the nanowire structure that are not accessible via conventional ion implantation techniques. The formation of one such embodiment is described below in conjunction with FIG. 6 and FIGS. 7A-7E.

Figure 6:
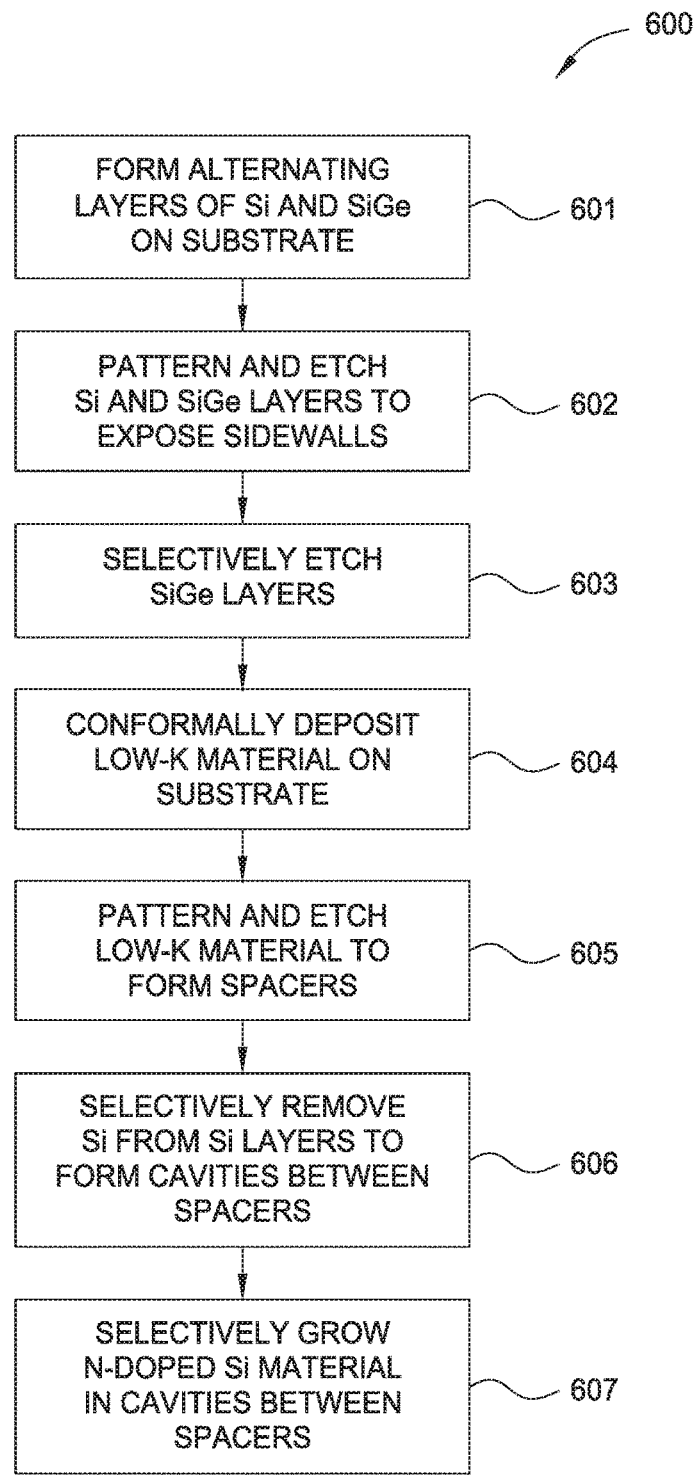
FIG. 6 is a flowchart of a manufacturing process for forming a nanowire structure, according to various embodiments of the disclosure.

FIG. 6 is a flowchart of a manufacturing process 600 for forming a nanowire structure 700, according to various embodiments of the disclosure. FIGS. 7A-7E are schematic cross-sectional views of the nanowire structure 700 corresponding to various stages of process 600, according to embodiments of the disclosure. Although process 600 is depicted for forming an n-doped region in a nanowire structure, process 600 may be employed to form other structures on a substrate as well.

Figure 7A:
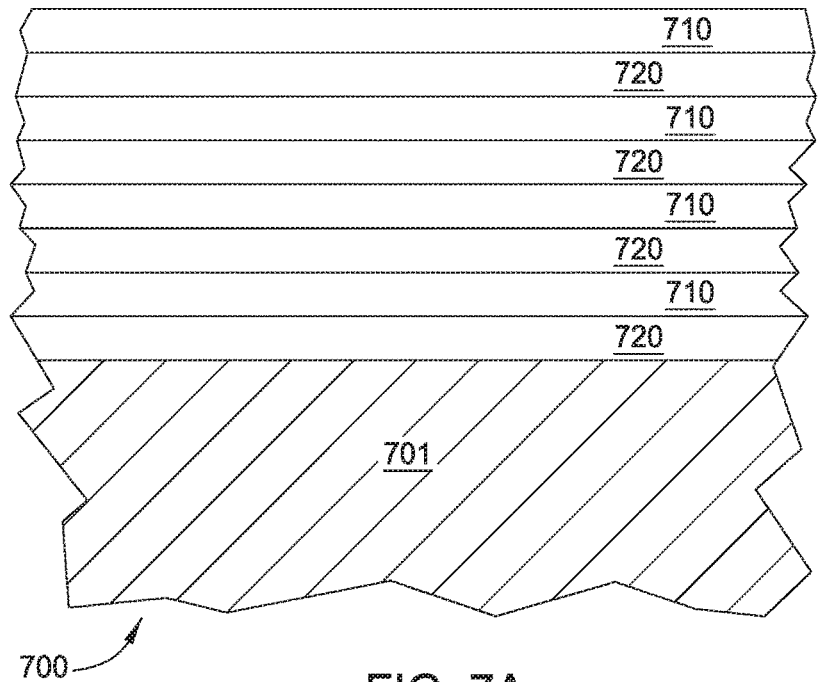
FIGS. 7A-7G are schematic cross-sectional views of the nanowire/nanosheet structure of FIG. 7 corresponding to various stages of the process of FIG. 6, according to embodiments of the disclosure.

Process 600 begins at step 601, in which alternating silicon layers 710 and silicon-germanium (SiGe) layers are formed on a bulk semiconductor substrate 701, as illustrated in FIG. 7A. Bulk semiconductor substrate 701 may be formed of silicon, silicon germanium, or any other suitable bulk crystalline semiconductor material. Silicon layers 710 and silicon-germanium layers 720 may each be formed via a SEG process, and typically include a crystalline semiconductor material.

Figure 7B:
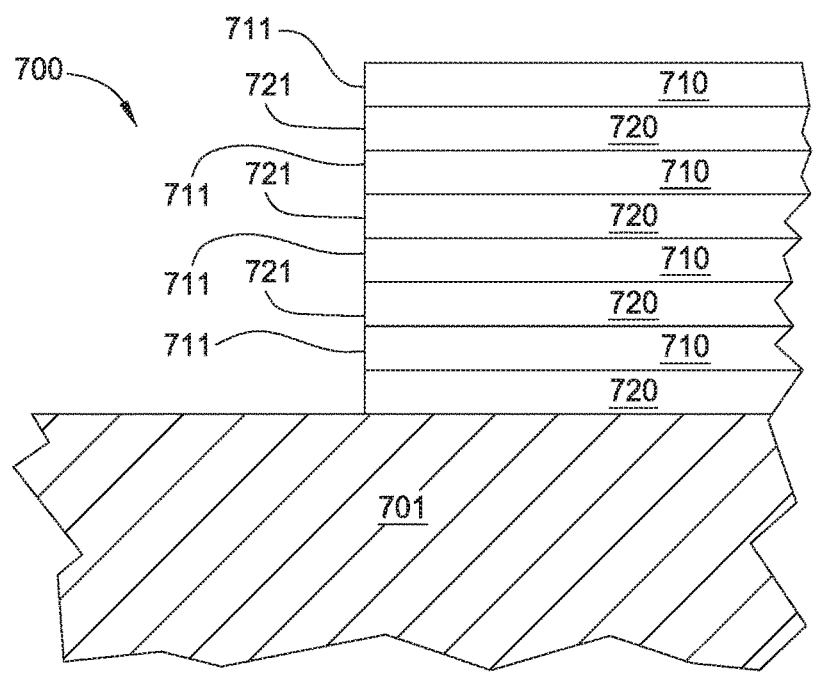

In step 602, silicon layers 710 and silicon-germanium layers 720 are patterned and etched to expose vertical sidewalls 711 on silicon layers 710 and vertical sidewalls 721 on silicon-germanium layers 720, as illustrated in FIG. 7B. In some embodiments, step 602 includes a DRIE process.

Figure 7C:
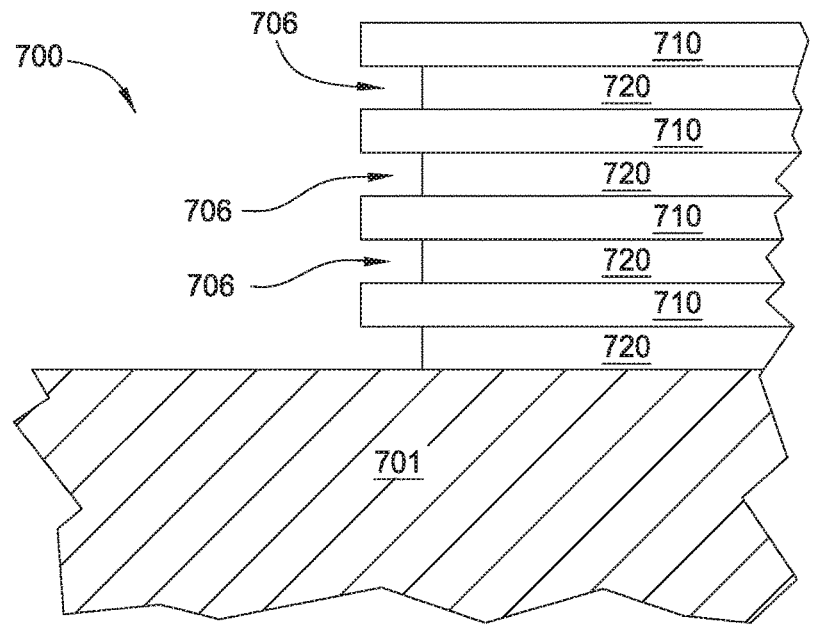

In step 603, silicon-germanium layers 720 are selectively etched inward from vertical sidewalls 721, to form cavities 706, as illustrated in FIG. 7C. In some embodiments, a chemical vapor etching (CVE) process is used to selectively remove silicon-germanium layers 720 over silicon layers 710. For example, gaseous hydrochloric acid selective etching of SiGe versus Si in a reduced pressure-chemical vapor deposition reactor has been demonstrated, as described in "High pressure in situ HCl etching of Si1-xGex versus Si for advanced devices," V Destefanis, et al, Semicond. Sci. Technol. 23 (2008). Alternatively, an ex-situ HF-dip followed by a GeH$_4$-enhanced Si etch that is performed in-situ in an epi reactor can be employed in step 603. One such process is described in "High Efficiency Low Temperature Pre-epi Clean Method For Advanced Group IV Epi Processing", V. Machkaoutsan et al., ECS Transactions, 50 (9) 339-348 (2012).

Figure 7D:
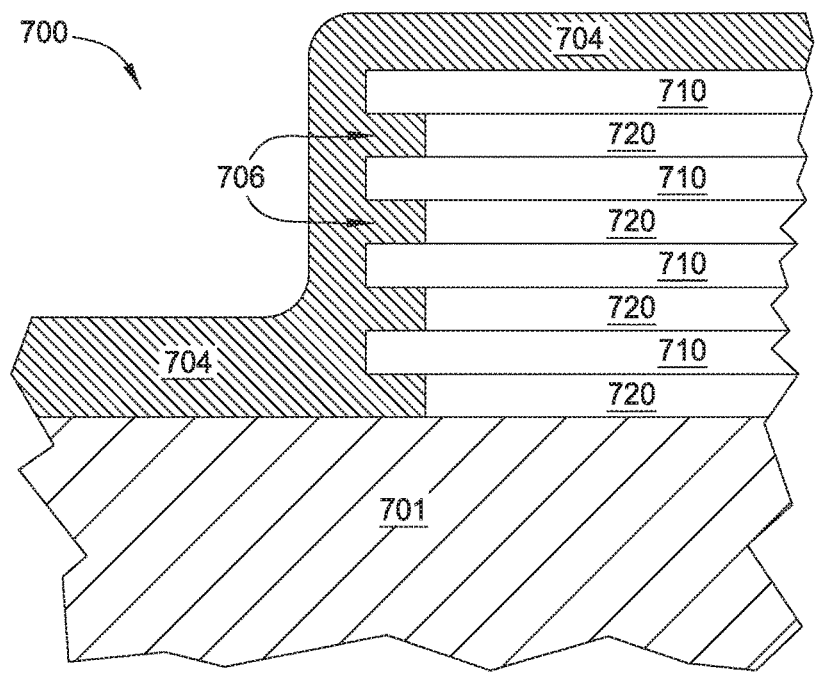

In step 604, a low-k material 704 is then conformal deposited on bulk semiconductor substrate 701, as illustrated in FIG. 7D. Low-k material 704 fills at least a portion of cavities 706.

Figure 7E:
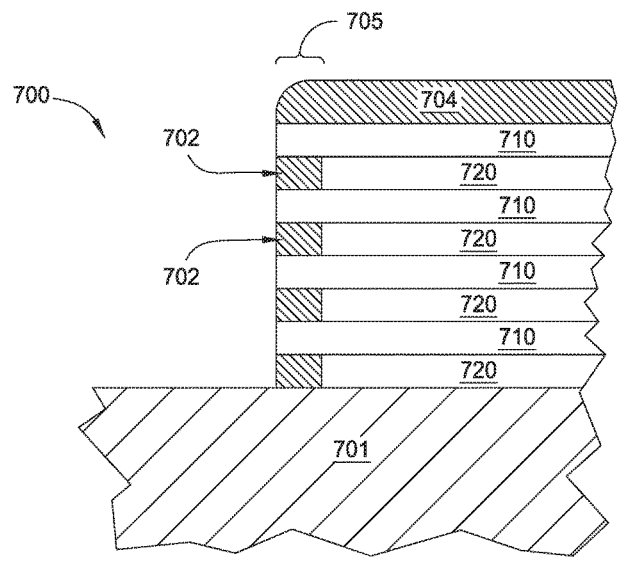

In step 605, low-k material 704 is patterned and etched to expose vertical sidewalls 711 on silicon layers 710 and filled cavities 706 on silicon-germanium layers 720, as illustrated in FIG. 7E. In some embodiments, step 605 includes a DRIE process. The filled cavities 706 form spacers 702, where each spacer 702 is formed at an edge region 705 of a silicon-germanium layer 720.

Figure 7F:
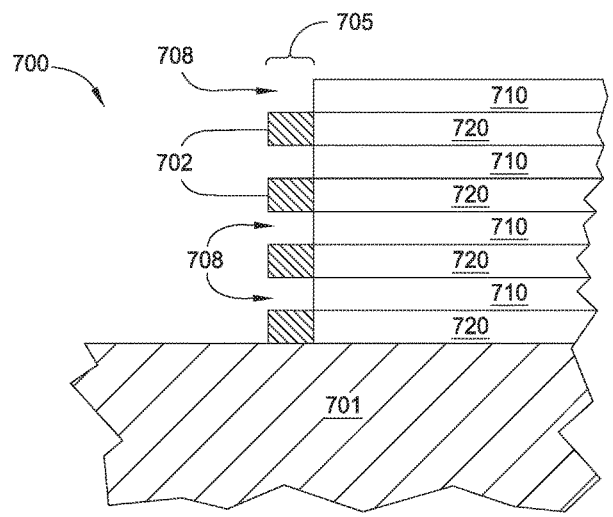

In step 606, portions of silicon layers 710 are selectively removed from the edge regions 705 to form cavities 708, as shown in FIG. 7F. Silicon may be removed from edge regions 705 via a CVE process, such as a CVE process that is selective to silicon over spacers 702. In some embodiments, the CVE process may include one or more of an HCl-based CVE process, an HCl- and GeH$_4$-based CVE process, and/or a Cl$_2$-based CVE process.

Figure 7G:
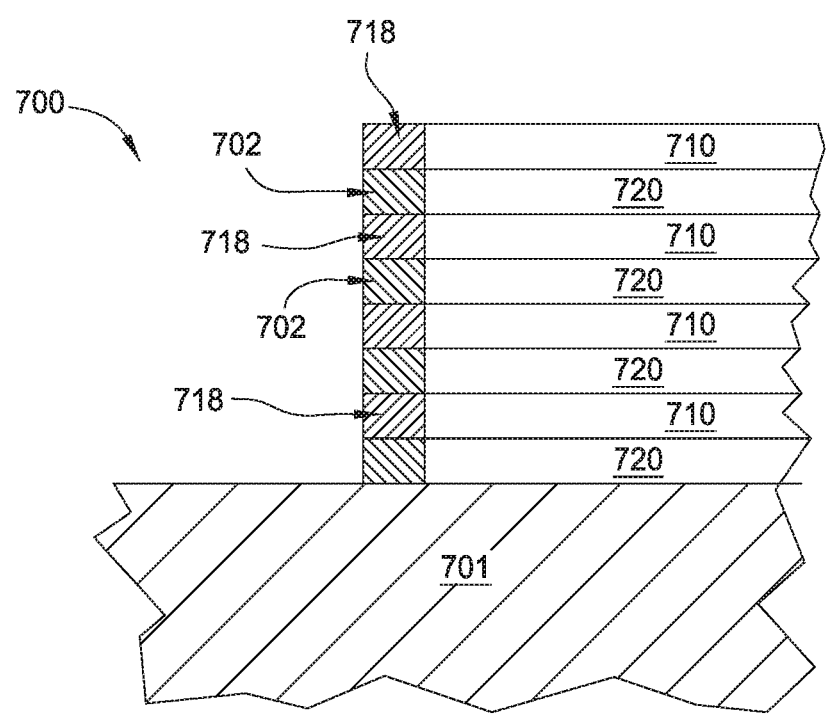

In step 607, an n-doped silicon material 718 is grown in cavities 706 via a SEG process, as illustrated in FIG. 7G. In some embodiments, the n dopant is arsenic, and the n-doped silicon material includes Si:As. In such embodiments, the SEG process of step 605 may be substantially similar to the SEG process of step 305 in process 300, which is set forth above.

In alternative embodiments, spacers 702 may be formed by selectively oxidizing portions of silicon-germanium layers 720, rather than selectively etching portions of silicon-germanium layers 720 that are then filled with low-k material 704.

Implementation of process 600 enables the formation of nanowire structure 700 that includes n-doped regions, i.e., cavities 706 filled with n-doped silicon material 708. It is noted that the above-described n-doped regions are not accessible by line-of-sight ion implantation techniques, since cavities 706 are disposed between an existing structure of nanowire structure 700 and a bulk semiconductor portion of semiconductor substrate 701. Consequently, such n-doped regions cannot be formed via conventional techniques.

In sum, one or more embodiments of the present disclosure provide systems and techniques for forming regions of n-doped semiconductor material that are disposed between an existing structure of a semiconductor device and a bulk semiconductor portion of the semiconductor substrate on which the n-doped silicon-containing material is formed. In embodiments in which the semiconductor device comprises a finFET device, the n-doped semiconductor material forms an n-doped source and/or drain extension disposed between a gate spacer of the finFET and a bulk semiconductor portion of the semiconductor substrate on which the n-doped source or drain extension is disposed.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device on a semiconductor substrate, the method comprising:
    performing an anisotropic etch process on a semiconductor material to expose a surface in the semiconductor material, wherein the exposed surface is disposed between an existing structure of the semiconductor device and a bulk semiconductor portion of the semiconductor substrate on which the semiconductor material is formed;
    performing an isotropic etch process on an exposed sidewall to form a cavity in the semiconductor material that is disposed between the existing structure and the bulk semiconductor portion of the semiconductor substrate; and
    forming a layer of deposited material via a selective epitaxial growth (SEG) process on a surface of the cavity, wherein the deposited material includes silicon and an n-type dopant.

2. The method of claim 1, further comprising performing a pre-epitaxial clean process on the surface of the cavity, wherein the pre-epitaxial clean process includes exposure of the surface of the cavity to hydrogen and fluorine species.

3. The method of claim 2, wherein exposure of the surface of the cavity further comprises exposing the surface to plasma-excited hydrogen and fluorine species by simultaneously exposing the surface of the cavity to H, $NF_3$, and $NH_3$ plasma-excited species.

4. The method of claim 1, wherein the isotropic etch process comprises an etch process selective to the semiconductor material.

5. The method of claim 4, wherein the isotropic etch process comprises a chemical vapor etch process that includes exposing the exposed sidewall to at least one of HCl, HCl and $GeH_4$, and $Cl_2$.

6. The method of claim 1, wherein forming the layer of deposited material comprises filling the cavity with the deposited material.

7. The method of claim 1, further comprising, prior to forming the layer of deposited material, depositing a carbon-containing material on the surface of the cavity, wherein the carbon-containing material includes a silicon-carbon-phosphorus (SiCP) material.

8. The method of claim 7, wherein the SiCP material includes about 0.1 to 2.0 atomic percent carbon and about $1E10^{20}$ atoms/$cm^3$ to $1E10^{21}$ atoms/$cm^3$ phosphorus.

9. The method of claim 1, wherein performing the isotropic etch process on the exposed sidewall to form the cavity in the semiconductor material comprises removing semiconductor material until a portion of the semiconductor material that comprises a phosphorus-doped bulk semiconductor material is exposed.

10. The method of claim 1, wherein the n-type dopant comprises arsenic (As), and the selective epitaxial growth (SEG) process includes exposing the surface of the cavity to at least one of $AsCl_3$, TBA, or $AsH_3$ and at least one of dichlorosilane (DCS), HCl, $SiH_4$, $Si_2H_6$, or $Si_4H_{10}$.

11. The method of claim 10, wherein forming the layer of deposited material comprises filling the cavity with arsenic-doped material having an arsenic concentration sufficient to produce a targeted tensile strain within the deposited material.

12. The method of claim 1, further comprising forming a layer of additional deposited material via a selective epitaxial growth (SEG) process on a portion of the semiconductor material on which the anisotropic etch process is not performed, wherein the additional deposited material includes silicon (Si) and phosphorus (P).

13. The method of claim 12, wherein the layer of additional deposited material is formed without exposing the layer of deposited material formed on the surface of the cavity to air.

14. The method of claim 13, wherein the forming the layer of additional deposited material is performed in a same processing chamber as the forming the layer of deposited material on the surface of the cavity.

* * * * *